United States Patent
Li et al.

(10) Patent No.: US 8,614,266 B2
(45) Date of Patent: Dec. 24, 2013

(54) POTTING FOR ELECTRONIC COMPONENTS

(75) Inventors: Haiying Li, Elk Grove, CA (US);
William Lee Harrison, El Dorado Hills, CA (US)

(73) Assignee: Tyco Electronics Services GmbH, Schaffhausen (CH)

( * ) Notice: Subject to any disclaimer, the term of this patent is extended or adjusted under 35 U.S.C. 154(b) by 252 days.

(21) Appl. No.: 13/102,029

(22) Filed: May 5, 2011

(65) Prior Publication Data

US 2011/0272191 A1 Nov. 10, 2011

Related U.S. Application Data

(60) Provisional application No. 61/343,975, filed on May 5, 2010.

(51) Int. Cl.
*C08K 3/10* (2006.01)
*C08K 7/18* (2006.01)
*C08L 9/00* (2006.01)
*C08L 63/00* (2006.01)

(52) U.S. Cl.
USPC .......................................... 523/428; 525/113

(58) Field of Classification Search
None
See application file for complete search history.

(56) References Cited

U.S. PATENT DOCUMENTS

| | | | |
|---|---|---|---|
| 3,351,574 A * | 11/1967 | Hicks et al. | 528/111.3 |
| 3,370,348 A * | 2/1968 | Brownlow et al. | 29/604 |
| 3,470,110 A | 9/1969 | Renner | |
| 4,876,298 A | 10/1989 | Itoh et al. | |
| 5,102,960 A | 4/1992 | Imai et al. | |
| 5,108,824 A | 4/1992 | Wang et al. | |
| 5,319,005 A | 6/1994 | Hagiwara et al. | |
| 5,659,004 A | 8/1997 | Takigawa et al. | |
| 5,686,541 A | 11/1997 | Wang et al. | |
| 5,698,904 A | 12/1997 | Tsuji | |
| 5,952,446 A | 9/1999 | Krebaum | |
| 6,057,402 A | 5/2000 | Zhou | |
| 6,117,953 A | 9/2000 | Ichiroku et al. | |
| 6,127,460 A | 10/2000 | Kazuto | |
| 6,172,141 B1 | 1/2001 | Wong et al. | |
| 6,569,532 B2 | 5/2003 | Tomiyoshi et al. | |
| 7,034,405 B2 * | 4/2006 | Toyoda et al. | 257/788 |
| 7,060,761 B2 | 6/2006 | Arai et al. | |
| 7,384,682 B2 | 6/2008 | Papathomas | |
| 7,675,185 B2 | 3/2010 | Tendou et al. | |
| 2006/0015782 A1 | 1/2006 | Herley | |
| 2006/0197066 A1 | 9/2006 | Cheng et al. | |
| 2008/0090930 A1 * | 4/2008 | Madhusoodhanan et al. | 522/83 |
| 2008/0199717 A1 * | 8/2008 | Barker | 428/577 |

FOREIGN PATENT DOCUMENTS

| | | |
|---|---|---|
| DE | 10017783 A1 | 10/2001 |
| EP | 0582225 A2 | 2/1994 |
| FR | 1535089 A | 8/1968 |

OTHER PUBLICATIONS

Catalog of Chemical Suppliers, linoleic acid dimer, 2013, one page.*
Momentive product selector, Heloxy Epoxy Functional Modifiers, 2012, eight pages.*
Momentive technical data sheet for Heloxy Modifier 505, 2006, five pages.*
International Search Report, International Application No. PCT/US2011/035435, International Filing Date May 5, 2011.

* cited by examiner

*Primary Examiner* — Robert Sellers

(57) ABSTRACT

A potting material for an electronic component, an electronic component, and a process for positioning ferrites in an electronic material are disclosed. The potting material is formed by curing a mixture. The mixture includes an epoxy component, an organic amine hardener, a viscosity-controlling agent, and a silica. The potting material has a coefficient of thermal expansion between an inorganic ferrite coefficient of thermal expansion and an organic substrate coefficient of thermal expansion of the electronic component. The potting material includes a rigidity permitting via drilling by one or more of mechanical drilling and laser burning.

18 Claims, 4 Drawing Sheets

POTTING FOR ELECTRONIC COMPONENTS

FIELD OF THE INVENTION

The present invention relates generally to electronic products and potting materials and processes for fabricating electronic products. More particularly, the present invention relates to potting for use with ferrites.

BACKGROUND OF THE INVENTION

Electronic components such as semiconductors are widely used in many products. These components are being miniaturized for high-density semiconductor devices. However, competing with this need for smaller dimensions is the increasing need for functionality that the consumers of semiconductor devices desire. This increase in functionality can affect the size and complexity of the semiconductors and the number of semiconductors per module.

For example, a transmitter-receiver or transceiver installed on a computer, is a device that both transmits and receives analog or digital signals. The basic element of a transceiver is an inductor which is a ferrite routed with insulated conducting metal wires. Current manufacturing technology of transceivers are based on manual wiring of ferrite rings due to the limitation of wiring machines threading through a small ferrite ring. Such manual wiring can limit the ability to miniaturize a transceiver and can result in substantial manufacturing costs.

In electronic components such as transceivers, a thermal coefficient of expansion (TCE) mismatch between interfaces of different materials such as ferrite, potting materials, and substrates becomes serious in particular with the larger integrated circuit (IC) elements, when working with a high TCE, when working with low-cost organic substrates, and/or when working with fine circuitry. Due to the TCE mismatch, temperature cycling excursions generate thermo-mechanical stresses to the interfaces of material between ferrites, organic potting materials, organic substrates, and metal vias. These stresses can degrade a product.

Attempts to embed ferrites in electronic components have been made with epoxy laminates and/or potting materials having rigid molecular structures such as high aramid content. Such laminates and materials have stiffness after being cured which can result in excessive stress. The excessive stress can greatly malfunction ferrites and cause failure modes of cracking and breakage of electronic components. Also, known materials do not flow enough to fill tall structures and can trap air bubbles causing devices to crack during solder reflow cycles.

Potting for electronic components not suffering from the above drawbacks would be desirable in the art.

BRIEF DESCRIPTION OF THE INVENTION

According to an embodiment, a potting material for an electronic component is formed by curing a mixture. The mixture includes an epoxy component having a long hydrocarbon-chain epoxy and an epoxy terminated butadiene polymer, an organic amine hardener, a viscosity-controlling agent, and a silica.

According to another embodiment, an electronic component includes a potting material, the potting material formed by curing a mixture. The mixture includes an epoxy component, an organic amine hardener, a viscosity-controlling agent, and a silica. The electronic component further includes an inorganic ferrite having an inorganic ferrite coefficient of thermal expansion and an organic substrate having an organic substrate coefficient of thermal expansion. The potting material has a coefficient of thermal expansion between the inorganic ferrite coefficient of thermal expansion and the organic substrate coefficient of thermal expansion.

According to another embodiment, a process of positioning ferrites in an electronic component includes applying a mixture to an organic substrate and curing the mixture to form a potting material and applying the ferrites, the ferrites being applied by one or more of applying the ferrites to the organic substrate as a part of the mixture and applying the ferrites to the potting material. The mixture includes an epoxy component, an organic amine hardener, a viscosity-controlling agent, and a silica. The potting material has a thermal coefficient of expansion between an inorganic ferrite coefficient of thermal expansion and an organic substrate coefficient of thermal expansion of the electronic component.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is an exemplary potting material for an electronic component, an exemplary electronic component, and an exemplary process for positioning ferrites in an electronic material. Embodiments of the present disclosure extend the life of electronic components, permit decreased costs in the manufacturing of electronic components, decrease stress between portions of electronic components, increase resistance to thermo-mechanical stresses, decrease material costs, permits flow of potting into taller structures, reduce cracking from solder reflow cycles, permit joining of semiconductor devices, permit ferrites to be embedded without being hand wound or machine wound on bobbins, and combinations thereof.

The term "alkyl" as used herein refers to a branched or unbranched saturated hydrocarbon group of 1 to 24 carbon atoms, such as methyl ("Me"), ethyl ("Et"), n-propyl, isopropyl, n-butyl, isobutyl, t-butyl, octyl, decyl, and the like. In one embodiment, alkyl groups herein contain from 1 to 12 carbon atoms. As used herein, "substituted" is used to refer, generally, to a carbon or suitable heteroatom having a hydrogen or other atom removed and replaced with a further moiety. Moreover, it is intended that "substituted" refer to substitutions, which do not change the basic and novel utility of the underlying compounds, products or compositions of the present invention.

Figure 1:
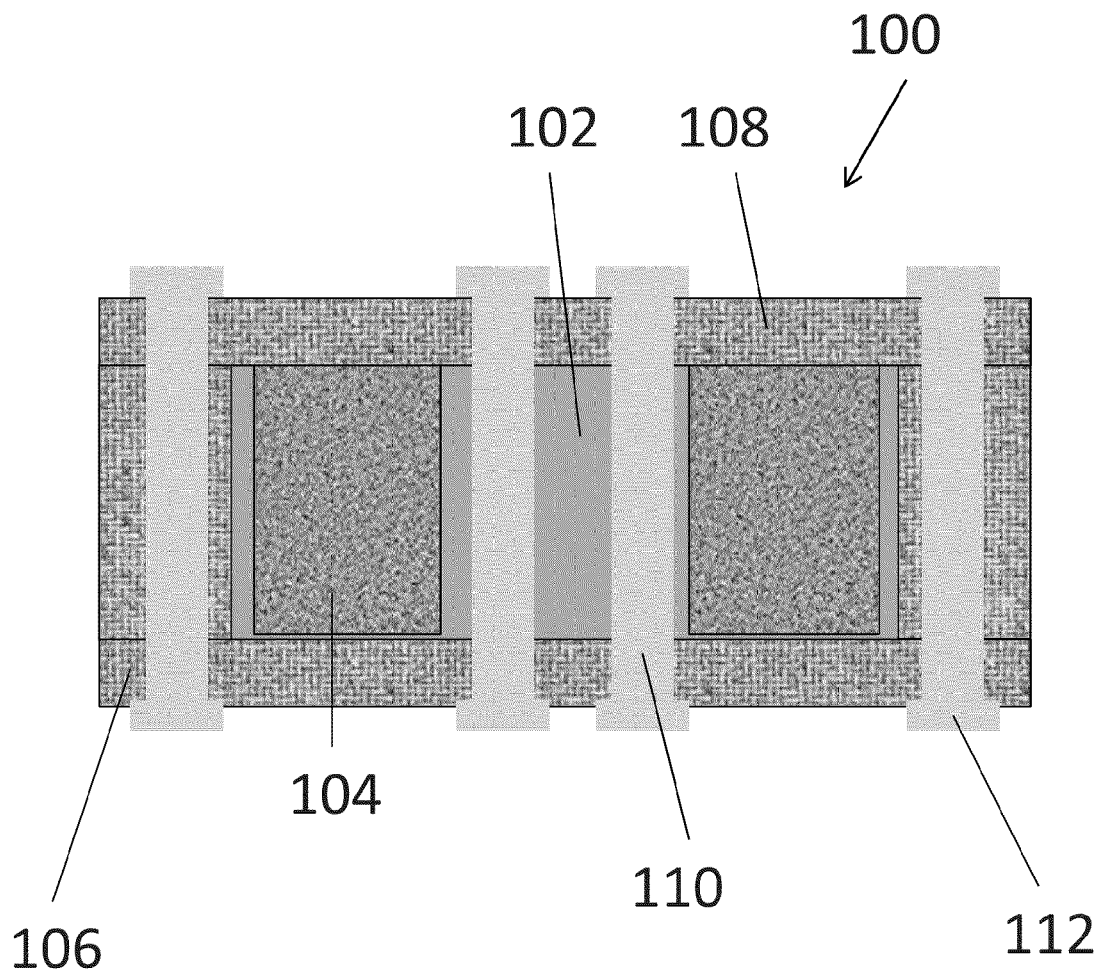
FIG. 1 shows a schematic cross-section of an exemplary electronic component according to the disclosure.

Referring to FIG. 1, an electronic component 100, such as a semiconductor, is disclosed. The electronic component 100 includes a potting material 102, an inorganic ferrite 104 (or other magnetic metallic oxide permitting inductance), and an organic substrate 106, such as a printed circuit board or printed wiring board. In one embodiment, the organic substrate 106 is an FR4 printed circuit board. The electronic component 100 includes any other suitable features. Suitable features include, but are not limited to conductive sheets 108, such as copper sheets, conductive paths 110, or conductive or dielectric features permitting signals and/or power to be transmitted and/or received by the electronic component 100.

Figure 2:
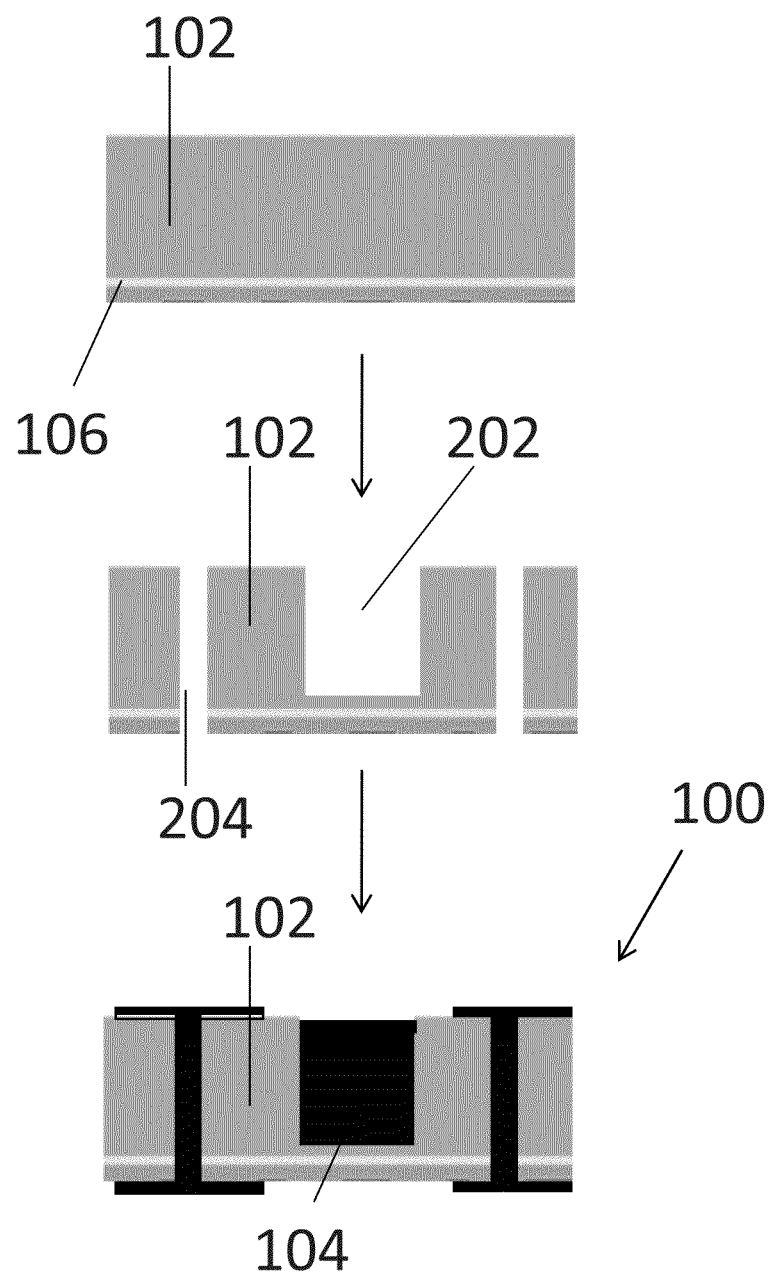
FIG. 2 schematically shows an exemplary process of positioning ferrites in an electronic component according to the disclosure.
Figure 3:
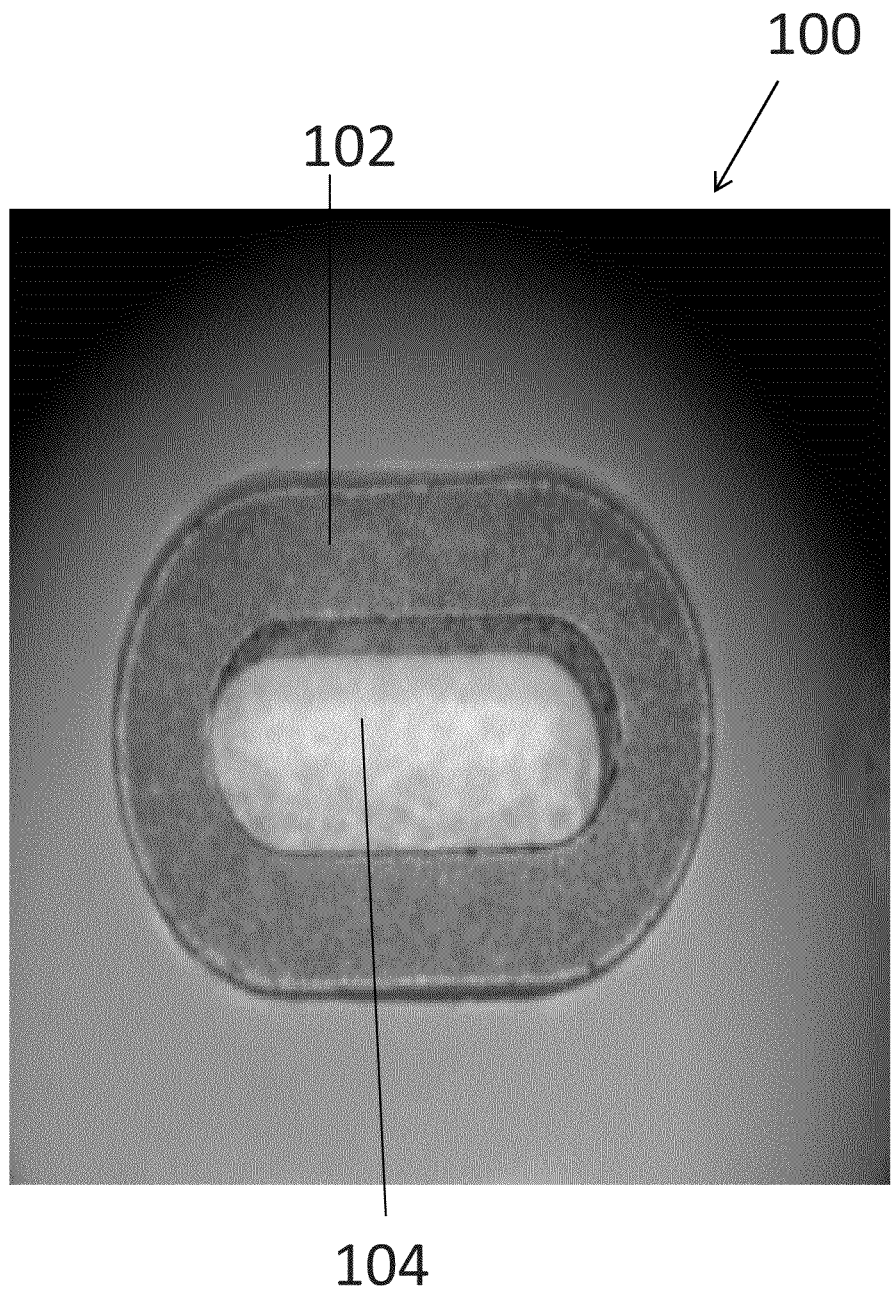
FIG. 3 shows a top view of an exemplary electronic component having an embedded ferrite according to the disclosure.
Figure 4:
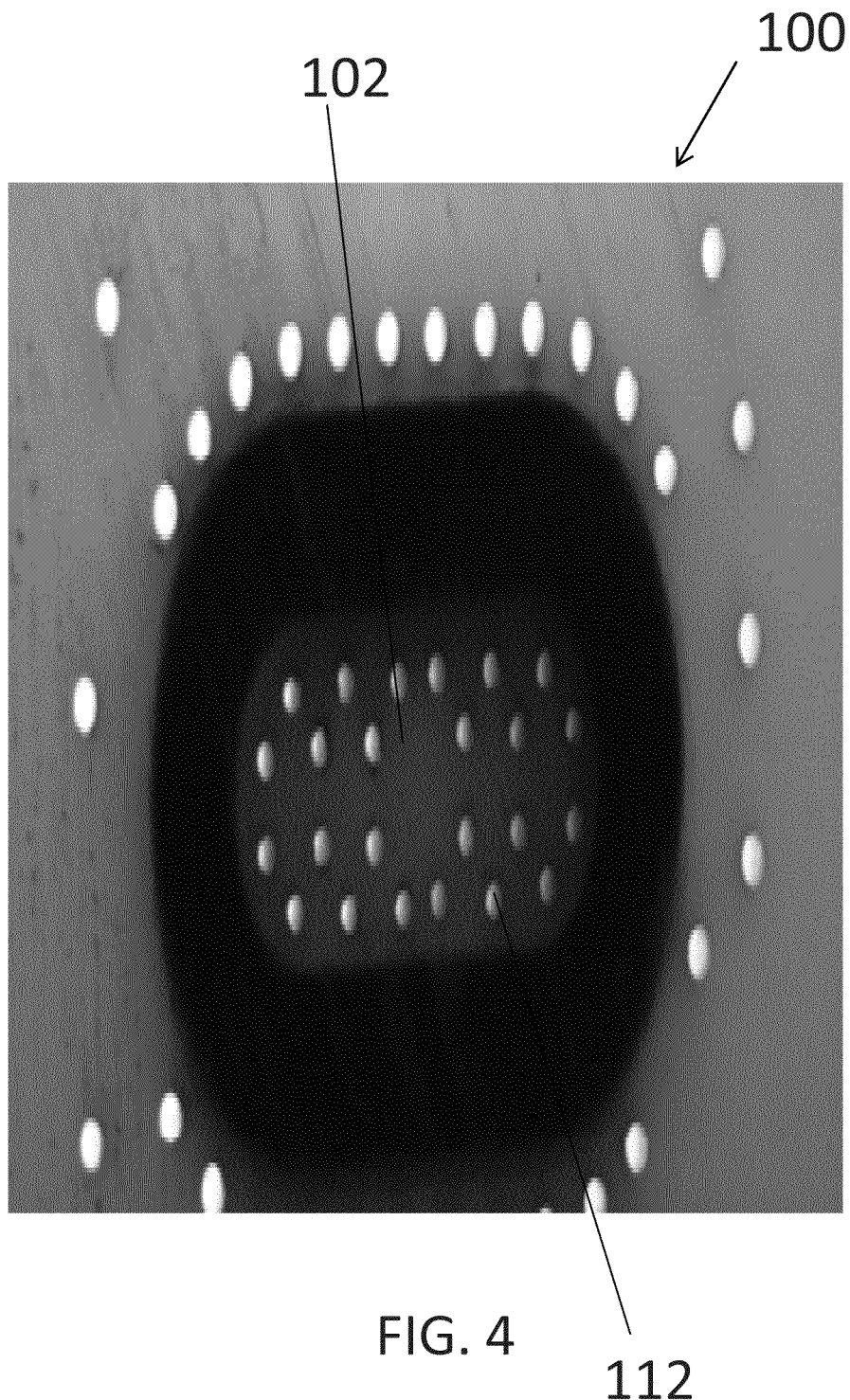
FIG. 4 shows a top view of an exemplary electronic component having a via according to the disclosure.

Referring to FIG. 2, the inorganic ferrites 104 are positioned in the electronic component 100 by applying a mixture (not shown) to the organic substrate 106 and curing the mixture to form the potting material 102. Concurrently or subsequently, the inorganic ferrites 104 are applied. In one embodiment, the inorganic ferrites 104 are applied to the organic substrate 106 as a part of the mixture. As further shown in FIG. 3, in one embodiment, the inorganic ferrites 104 are applied to the potting material 102 by drilling a ferrite recess 202. As further shown in FIG. 4, in one embodiment, one or more vias 112, such as copper vias, are applied to the potting material 102 by drilling via holes 204 through mechanical drilling, laser burning, or combinations thereof.

Referring again to FIG. 1, the potting material 102 has a coefficient of thermal expansion between a coefficient of thermal expansion of the inorganic ferrites 104 (for example, about 2.5 ppm) and a coefficient of thermal expansion of the organic substrate 106 (for example, between about 18 to about 24 ppm). In one embodiment, the potting material 102 cures at room temperature, adheres to the inorganic ferrites 104, adheres to the organic substrate 106, adheres laminating materials (not shown), is plat-able with copper or other conductive metals, includes a relatively low volume of shrinkage during curing, has a decomposition temperature of greater than 260 degrees Celsius, and combinations thereof.

The potting material 102 includes an epoxy component, an organic amine hardener, a viscosity-controlling agent, and a silica. The epoxy component includes a predetermined molecular weight. For example, a suitable predetermined molecular weight based upon co-polymers and/or oligomers within the epoxy component is between about 1300 and about 2600. The epoxy includes a curing peak between about 90 degrees Celsius and about 240 degrees celsius. In one embodiment, the epoxy component forms between about 10% by weight and about 40% by weight of the mixture. Further embodiments of the mixture include the epoxy component between about 20% and about 40%, between about 30% and about 40%, at an amount above about 20%, at an amount above about 30%, at an amount above about 40%, or other suitable amounts within.

The epoxy component includes a long-chain epoxy and an epoxy terminated butadiene polymer or oligomer. In one embodiment, the long-chain epoxy includes or is a long linear branched or un-branched chain epoxy terminated hydrocarbon compounds having molecular weights greater than about 700. In one embodiment, the long-chain epoxy includes or is 9-octa-decenoic acid, 12-(2-oxiranylmethoxy)-1,2,3-propanetriyl ester, polytetramethylene glycol digylcidylether, or any combination thereof. In one embodiment, the long-chain epoxy forms, by weight, between about 3% and about 10% of the mixture, between about 5% and about 8% of the mixture, between about 8% and about 10% of the mixture, about 3% of the mixture, about 5% of the mixture, about 8% of the mixture, about 10% of the mixture, above about 3% of the mixture, above about 5% of the mixture, above about 8% of the mixture, above about 10% of the mixture, or other suitable amounts within.

In one embodiment, the epoxy terminated butadiene polymer includes or is epoxy terminated 1,3-butadiene. In one embodiment, the epoxy terminated butadiene polymer forms, by weight, between about 3% and about 10% of the mixture, between about 5% and about 8% of the mixture, between about 8% and about 10% of the mixture, about 3% of the mixture, about 5% of the mixture, about 8% of the mixture, about 10% of the mixture, above about 3% of the mixture, above about 5% of the mixture, above about 8% of the mixture, above about 10% of the mixture, or other suitable amounts within.

The epoxy component includes other suitable epoxies. In one embodiment, the epoxy component further includes bisphenol-A type epoxy resin and/or bisphenol-F type epoxy resin. In one embodiment, the bisphenol A type epoxy resin or the bisphenol F type epoxy resin form between about 2% and about 6% of the mixture, between about 3% and about 5% of the mixture, about 2% of the mixture, about 6% of the mixture, or other suitable amounts within.

In one embodiment, the bisphenol A-type epoxy resins are selected from glycidyl ether epoxides containing more than one 1,2 epoxy group per molecule. These are generally prepared by the reaction of 1 mole bisphenol A and 2 mole epichlorohydrin in basic media. In this embodiment, the bisphenol A-type epoxide will have the formula that includes:

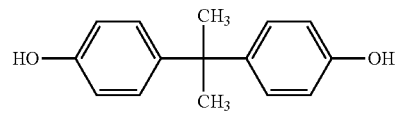

where CH3 is CH3 or H or Br.

In one embodiment, the bisphenol F type epoxy resins are selected from glycidyl ether epoxides containing more than one 1,2 epoxy group per molecule. These are generally prepared by the reaction of 1 mole bisphenol F and 2 mole epichlorohydrin in basic media. In this embodiment, the bisphenol F type epoxides will have the formula that includes:

Bisphenol F

Other suitable epoxies include, but are not limited to, resins such as cycloaliphatic epoxy resin, epoxy novolac resin, biphenyl type epoxy resin, naphthalene type epoxy resin, dicyclopentadiene-phenol type epoxy resins, 2,2-bis(4-hydroxyphenyl) propane-epichlorohydrin copolymer (R1=H) and 2,2'-{3,3',5,5'-tetramethyl{2,2' biphenyl}(-4,4'-diyl)bis (oxymethylene)}bisoxirane (R1=CH3), and other suitable combinations and sub-combinations thereof. In one embodiment, the epoxy component includes three linear aliphatic epoxides. In one embodiment, the epoxy component includes a carboxylate terminated butadiene acrylonitrile (CTBA). In this embodiment, the CTBA forms, by weight, between about 1% and about 5% of the mixture, between about 2% and about 5% of the mixture, greater than about 2% of the mixture, or any suitable combination or sub-combination thereof.

The organic amine hardener permits curing of the mixture to form the potting material 102. The organic amine hardener forms, by weight, between about 2% and about 5% of the mixture, between about 3% and about 4% of the mixture, greater than about 2% of the mixture, greater than about 4% of the mixture, greater than about 5% of the mixture, or other suitable combinations and sub-combinations thereof. Suitable organic amine hardeners include, but are not limited to, an alkyl-substituted amine, an aryl-substituted amine, an alkyl-substituted amine salt, an inorganic derivative of ammonia or an amine, a chloramine, a modified polyethylenepolyamine adduct, a tetraethylenepentamine, a diethylenetriamine, a triethylenetetramine, a polyaminoamide, or any combinations or sub-combination thereof.

The amount of the organic amine hardener depends upon the type of amine that is used. If triethylenetetramine is used, 14 parts of it by weight is added to 100 parts of one or more of the epoxy resins. If a polyaminoamide (the product of reaction between an unsaturated 18 carbon fatty acid dimer with polyethylenepolyamines) is used, then 30 to 50 parts by weight is added to 100 parts of one or more of the epoxy resins. In one embodiment, the organic amine hardener is in a liquid form at room temperature. In another embodiment, the organic amine hardener is in solid form at room temperature and is melted when added to the mixture. Examples of suitable amine hardeners include, but are not limited to, modified polyethylenepolyamine adducts, tetraethylenepentamine, diethylenetriamine, Triethylenetetramine, and polyaminoamide (the product of reaction between an unsaturated 18 carbon fatty acid dimer with polyethylenepolyamines). In one embodiment, the organic amine hardeners includes triethylenetetramine, tetraethylenepentamine, and polyaminoamide (the product of reaction between an unsaturated 18 carbon fatty acid dimer with polyethylenepolyamines) and combinations thereof, where R1, R2, R3, R4, and R5, can be the same or different and can include H, C6 alkyls, and phenyl. The anionic counter ion AC~can be any suitable anionic moiety. In one embodiment, AC~ includes OAC~, AcAc~, C1_6 alkyl substituted OAc~, C-i.g alkyl substituted T, Br, Cl~, BF4~, PF6~, AsF6~, SbF6~, and CF3SO3~.

In one embodiment, the mixture includes a coupling agent. The coupling agent is a molecular coupling agent to improve adhesion between the potting material 102 and other materials. The coupling agent increases adhesion between the potting material 102 and the other materials. In one embodiment, the coupling material reacts to form a formula of $R_n(SiX)_{4-n}$ wherein n is from 1 to 3. In this embodiment, the X group is based upon the reaction with the inorganic or organic substrate. The bond between the X group and the silicon atom in the coupling agent is replaced by a bond between the inorganic ferrites 104 or the organic substrate 106. The X group is a hydrolyzable group, such as, alkoxy, acyloxy, amine, or chlorine. The R group is a nonhydrolyzable organic radical that possesses a functionality, which enables the coupling agent to bond with organic resins and polymers.

Suitable coupling agents are an epoxy type silane coupling agent, an amine type silane coupling agent, a mercapto type silane coupling agent, and combinations thereof. In one embodiment, the coupling agent forms, by weight, between about 0.5% and about 2% of the mixture, between about 1% and about 2% of the mixture, less than about 2% of the mixture, or any suitable combination or sub-combination thereof. In one embodiment, the coupling agent is an amine type silane coupling agent having at least one amino functional group. In a further embodiment, the coupling agent is selected from the group of the 4-amino butyl dimethyl methoxy silane, N-(2 amino ethyl)-3-amino propyl methyl dimethoxy silane, N-(2-amino ethyl)-3-amino propyl trimethoxy silane, 3-amino propyl methyl diethoxy silane, 3-amino propyl triethoxy silane, 3-amino propyl trimethoxy silane and combinations and sub-combinations thereof. In one embodiment, the coupling agent is an epoxy type silane coupling agent with at least one epoxy functional group, which includes 2-(3,4-epoxy cyclohexyl)ethyl trimethoxy silane, (3-glycidoxy propyl)bis(trimethyl siloxy)-methyl silane, 3-glycidoxy propyl diisopropyl ethoxy silane, 3-glycidoxy propyl dimethyl ethoxy silane, 3-glycidoxypropyl) methyl diethoxy silane, 3-glycidoxy propyl methyl diisopropenoxy silane, 3-glycidoxy propyl trimethoxy silane and combinations or sub-combinations thereof. In one embodiment, the coupling agent is a mercapto type silane coupling agent having at least one mercapto functional group such as 3-mercapto propyl methyl dimethoxy silane, 3-mercapto propyl trimethoxy silane, (mercapto methyl) dimethyl ethoxy silane, (mercapto methyl)methyl diethoxy silane, 3-mercapto propyl triethoxy silane and the like. In one embodiment, the coupling agent is a styryl type silane coupling agent having at least one styryl functional group such as styryl ethyl trimethoxy silane, 3-(N-Styryl methyl-2-amino ethyl amino)-propyl trimethoxy silane and combinations and sub-combinations thereof.

In one embodiment, the mixture includes a non-ionic surfactant. Suitable non-ionic surfactant are silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers, and combinations thereof. In one embodiment, the non-ionic surfactant is added to the mixture at a ratio of about 1 to 1.8 epoxide equivalent weight.

In one embodiment, the silica is a spherically shaped silica. In a further embodiment, all particles of the silica have a maximum dimension between about 2 microns and about 15 microns, between about 5 microns and about 10 microns, between about 4 microns and about 7 microns, greater than about 4 microns, greater than about 7 microns, less than about 15 microns, less than about 10 microns, or any combination or sub-combination thereof. In one embodiment, the silica is added to the mixture at a ratio of about 100 to 400 parts by weight to 100 parts of one or more of the epoxy resins.

The viscosity controlling agent is any suitable agent capable of modifying viscosity. In one embodiment, the viscosity controlling agent decreases the viscosity of the mixture. In another embodiment, the viscosity controlling agent increases the viscosity of the mixture. Suitable viscosity control agents include, but are not limited to resins such as epoxy resins capable of modifying viscosity. In one embodiment, the viscosity controlling agent forms, by weight, between about 10% and about 20% of the mixture, between about 15% and about 20% of the mixture, greater than about 10% of the mixture, greater than about 15% of the mixture, or any suitable combination or sub-combination within. According to an embodiment of the process, to avoid trapping air bubbles the viscosity is reduced by employing more less-viscous small epoxy molecules or epoxy diluents and/or by reducing the filler loading level.

In one embodiment, the mixture further includes various additives. These additives include toughening agents and fillers to obtain desired physical, mechanical, or electrical properties of the cured formulation, such as low thermal coefficient of expansion (TCE) and better thermal conductivity. In one embodiment, the mixture includes a filler material such as silica particles, silicon nitride particles, and/or aluminum nitride particles.

Example 1

A potting material was formed from a mixture containing 4 parts by weight of 4,4'-dihydroxy-2,2-diphenylpropane (bisphenol A), about 10 parts by weight of epoxy terminated butadiene epoxy co-polymer, about 10 parts of 9-octa-decenoic acid, 12-(2-oxiranylmethoxy)-1,2,3-propanetriyl ester, about 24 parts of 2,2'-[(2,2-dimethyl-1,3-propanediyl) bis(oxymethylene)]oxirane, about 1.5 parts of 3-glycidoxypropyl)-trimethoxysilane, about 120 parts by weight spherical amorphous fumed silica particles, and about 7 parts of triethylenetetramine. The mixture included desirable suitable viscosity for filling processing and desirable wetting on a circuit board of FR4 material and polymer coated ferrites. The potting material included desirable adhesion to the circuit board and the polymer coated ferrites and desirably low stress and toughness.

Example 2

A potting material was formed from a mixture containing 4 parts by weight of 4-[(4-hydroxyphenyl)methyl]phenol (bisphenol F), about 10 parts by weight of epoxy terminated butadiene Epoxy co-polymer, about 10 parts of 9-octa-decenoic acid, 12-(2-oxiranylmethoxy)-1,2,3-propanetriyl ester, about 24 parts of 2,2'-[2,2-dimethyl-1,3-propanediyl) bis (oxymethylene)]oxirane, about 1.5 parts of 3-glycidoxypropyl)-trimethoxysilane, about 120 parts by weight spherical amorphous fumed silica particles, and about 7 parts of triethylenetetramine. The mixture included desirable viscosity for filling and desirable wetting on a circuit board of FR4 material and polymer coated ferrites. The potting material included desirable adhesion to the circuit board and the polymer coated ferrites and desirably low stress as well as acceptable toughness.

Example 3

A potting material was formed from a mixture containing 4 parts by weight of 4-[(hydroxyphenyl)methyl]phenol (bisphenol F), about 10 parts by weight of epoxy terminated butadiene Epoxy co-polymer, about 10 parts of 9-octa-decenoic acid, 12-(2-oxiranylmethoxy)-1,2,3-propanetriyl ester, about 24 parts of 2,2[(2,2-dimethyl-1,3-propanediyl) bis(oxymethylene)]oxirane, about 1.5 parts of 3-glycidoxypropyl)-trimethoxysilane, about 150 parts by weight of spherical amorphous fumed silica particles, and about 28 parts of triethylenetetramine mixed with a polyaminoamide (the product of reaction between an unsaturated 18 carbon fatty acid dimer with polyethylenepolyamines) are used. The mixture included desirable suitable viscosity for filling processing and desirable wetting on a circuit board of FR4 material and polymer coated ferrites. The potting material included desirable adhesion to the circuit board and the polymer coated ferrites and desirably low stress and toughness. In addition, the potting material included higher flexibility than Example 1, longer extension length at break than Example 1, and greater reliability than Example 1.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A potting material for an electronic component, the potting material formed by curing a mixture, the mixture comprising:
   an inorganic ferrite;
   an epoxy component having a long hydrocarbon-chain epoxy and an epoxy terminated butadiene polymer;
   an organic amine hardener;
   a viscosity-controlling agent; and
   a silica.

2. The potting material of claim 1, wherein the epoxy terminated butadiene polymer forms above about 10% by weight of the mixture.

3. The potting material of claim 1, wherein the long-chain epoxy forms above about 10% by weight of the mixture.

4. The potting material of claim 1, wherein the silica is a spherically shaped silica.

5. The potting material of claim 1, wherein all particles of the silica have a maximum dimension between about 2 microns and about 15 microns.

6. The potting material of claim 1, wherein the organic amine hardener is selected from the group consisting of an alkyl-substituted amine, an aryl-substituted amine, an alkyl-substituted amine salt, an inorganic derivative of ammonia or an amine, a chloramine, a modified polyethylenepolyamine adduct, a tetraethylenepentamine, a diethylenetriamine, a triethylenetetramine, a polyaminoamide, and combinations thereof.

7. The potting material of claim 1, further comprising a silane coupling agent, the coupling agent selected from the group consisting of an epoxy silane coupling agent, an amine silane coupling agent, a mercapto silane coupling agent, and combinations thereof.

8. The potting material claim 1, wherein the potting material has a coefficient of thermal expansion between the coefficient of thermal expansion of the inorganic ferrite and an organic substrate coefficient of thermal expansion of the electronic component and wherein the potting material includes a rigidity permitting via drilling by one or more of mechanical drilling and laser burning.

9. The potting material of claim 1, comprising a decomposition temperature of greater than 260 degrees Celsius.

10. The potting material of claim 1, wherein the epoxy terminated butadiene polymer is epoxy terminated 1,3-butadiene.

11. The potting material of claim 1, further comprising a coupling agent.

12. The potting material of claim 11, wherein the coupling agent forms less than about 2% by weight of the mixture.

13. The potting material of claim 11, wherein the coupling agent reacts to form $R_n(SiX)_{4-n}$ wherein R is a non-hydrolyzable organic radical, X is a hydrolyzable group group selected from the group consisting of alkoxy, acyloxy, amine and chlorine, and n is from 1 to 3.

14. The potting material of claim 1, comprising holes drilled after the curing of the mixture.

15. The potting material of claim 14, wherein the holes are one or both of mechanically drilled and laser burned.

16. The potting material of claim 1, wherein the epoxy component includes a molecular weight of between about 1300 and about 2600.

17. The potting material of claim 1, further comprising silicon nitride particles.

18. The potting material of claim 1, further comprising aluminum nitride particles.

* * * * *